United States Patent [19]

Ahne

[11] Patent Number: 4,598,038
[45] Date of Patent: Jul. 1, 1986

[54] PREPARATION OF POLYIMIDE AND POLYISOINDOLOQUINAZOLINE DIONE RELIEF STRUCTURES

[75] Inventor: Hellmut Ahne, Röttenbach, Fed. Rep. of Germany

[73] Assignee: Siemens Aktiengesellschaft, Munich, Fed. Rep. of Germany

[21] Appl. No.: 716,673

[22] Filed: Mar. 27, 1985

[30] Foreign Application Priority Data

Mar. 29, 1984 [DE] Fed. Rep. of Germany ....... 3411697

[51] Int. Cl.$^4$ ................................................ G03C 1/70
[52] U.S. Cl. ..................... 430/283; 430/285; 430/286; 430/287; 430/288; 430/296; 430/303; 430/306; 430/906; 430/908
[58] Field of Search ............... 430/283, 285, 286, 287, 430/288, 296, 303, 306, 906, 908

[56] References Cited

U.S. PATENT DOCUMENTS 3,957,512  5/1976  Kleeberg et al. ................... 430/325
3,957,712  5/1976  Heyden et al. ...................... 260/314
4,311,785  1/1982  Ahne et al. ......................... 430/283

Primary Examiner—Lester L. Lee
Attorney, Agent, or Firm—Kenyon & Kenyon

[57] ABSTRACT

Highly heat resistant polyimide and polyisoindoloquinazoline dione relief structures can be produced by applying radiation-sensitive soluble polymer precursors in the form of a film or foil on a substrate, irradiating the film or foil through negative patterns with actinic light or electrons or a light, electron, ion or laser beam, removing the unirradiated film or foil portions and optionally by subsequent annealing. The relief structures are produced in an inexpensive manner with high purity and in a chloride-free form as well as having economically acceptable exposure times as a result of using as polymer precursors poly-condensation products which are prepared in the presence of carbodiimides. The polycondensation products are prepared from diamino compounds or diamino compounds having at least one orthopositioned amido group and olefinically unsaturated tetracarboxylic acid diesters of aromatic and/or heterocyclic tetracarboxylic acid dianhydrides and olefinically unsaturated alcohols. The relief structures produced by the method according to the invention are suitable in particular for use as resist, surface protection, and because of the high purity as durable protective and insulating material in the semiconductor field.

15 Claims, No Drawings

PREPARATION OF POLYIMIDE AND POLYISOINDOLOQUINAZOLINE DIONE RELIEF STRUCTURES

BACKGROUND OF THE INVENTION

The invention relates to a method for the preparation of highly heat resistant polyimide and polyisoindoloquinazoline dione relief structures in which radiation-sensitive soluble polymer precursors are applied to a substrate in the form of a film or foil, the film or foil is irradiated through negative patterns with actinic light, or with electrons, or by guiding a light, electron, ion or laser beam, the unirradiated film or foil portions are removed, and optionally the remaining irradiated portions are subsequently annealed. The invention also relates to the use of these relief structures.

Photo-structured polyimide and polyisoindoloquinazoline dione films are employed for example in the semiconductor industry as insulating and protective layers. Due to the severe cost pressure in the semiconductor sector, it is desirable to use low-cost materials and methods for the production of such films. This is why indirect photo-structuring of polyimide and polyisoindoloquinazoline dione films by means of conventional photo resists is not very appealing for the purpose mentioned. This method requires many steps and is very expensive.

From U.S. Pat. No. 3,957,512, a metnod related to that referred to above for the production of polyimide and polyisoindoloquinazoline dione relief structures is known. In this method, there are used as soluble polymer precursors polycondensation products of polyfunctional carbocyclic or heterocyclic compounds carrying radiation-sensitive radicals with diamines. The compounds carrying radiation-sensitive radicals here contain two carboxylic acid chloride groups suitable for condensation reactions and, partly in ortho- or peri-position thereto, radiation-sensitive groups bound to carboxyl groups in ester fashion. The diamines to be reacted with these compounds have at least one cyclic structure element.

The soluble polymer precursors are cross-linked during irradiation, being thus transformed into insoluble intermediate products. During annealing, these intermediate products undergo cyclization, with formation of highly heat resistant polyimides or polyisoindoloquinazoline diones.

The relief structures produced by the known method have proved successful in the practice. However, as a consequence of the manufacturing process in which acid chlorides are used, the polymer precursors used therein still contain a small residual chloride content, even after thorough purification. This residual chloride content may have a disturbing effect if the component requirements are extreme, as for instance in direct contact with P-N junctions in MOS components.

For the production of highly heat resistant polyimide and polyisoindoloquinazoline dione relief structures, a method is known further in which there are used as polymer precursors, addition products of olefinically unsaturated monoepoxides to carboxyl-group-containing polyaddition products of aromatic and/or heterocyclic tetracarboxylic acid dianhydrides and diamino compounds or diamino compounds having at least one ortho-positioned amido group (U.S. Pat. No. 4,311,785). As a result of the synthesis, however, these polymer precursors contain a relatively small proportion of photo-sensitive groups, resulting in a limited photo-sensitivity.

It is, therefore, an object of the invention to further improve the foregoing method for the preparation of polyimide and polyisoindoloquinazoline dione relief structures to the effect that in a cost-effective manner, high-purity and in particular, chloride-free relief structures can be produced using economically attractive exposure times.

SUMMARY OF THE INVENTION

According to the invention, this is achieved by using as polymer precursors polycondensation products of diamino compounds or diamino compounds having at least one ortho-positioned amido group with olefinically unsaturated tetracarboxylic acid diesters in the form of addition products of aromatic and/or heterocyclic tetracarboxylic acid dianhydrides and olefinically unsaturated alcohols. The precursor is applied as a foil or film to a substrate, the film or foil is irradiated or exposed through a negative image mask, to polymerize the unmasked portions, the unexposed or unirradiated portions are removed with solvent, and the resulting relief structure is optionally hardened by annealing. The synthesis of the precursors in a chloride-free fashion is obtained through the use of carbodiimides to produce the condensation reaction.

DETAILED DESCRIPTION OF THE INVENTION

The method according to the invention permits low-cost production of high-purity, i.e., in particular, chloride-free, relief structures, an especially essential feature being that the required exposure times permit a very economical structure production. Another advantage of this method is that low-flammability solvents miscible with water can be used as a developer, thus eliminating the need for expensive safety measures, such as explosion protection. Moreover, the relief structures produced by the method according to the invention can be transformed by means of a simple annealing process into highly heat resistant relief structures with a durable protective and insulating function, for example in semiconductor components. Besides, with the method according to the invention, the film thickness range that can be produced with a single application is unusually wide for a photoresist, so that also very thick films can be produced in a simple manner, for example, as for alpha-ray protection for memory components.

In the method according to the invention, the polymer precursors can advantageously be employed together with light- or radiation-sensitive compounds capable of copolymerization. To this end, preferably N-substituted maleimides are used. Alternatively acrylate- or methacrylate-group-containing compounds can be employed. Further also photo initiators and/or sensitizers can be used (cf."Industrie Chimique Belge", vol. 24, 1959, pp. 739 to 764; and J. Kosar, "Light-Sensitive Systems", John Wiley & Sons Inc., N.Y. 1965, pp. 143 to 146 and pp. 160 to 188). Especially suitable are imidazoles, in particular benzimidazoles, and ketocoumarins as well as Michler's ketone; suitable also for example are benzoin ether, 2-tertiary butyl-9,10-anthraquinone, 1,2-benz-9,10-anthraquinone and 4,4'-bis(diethylamino)-benzophenone. Also adhesion promoters can be used to advantage in the method according to the invention. Serviceable for this aspect are in particular silanes, such as vinyl triethoxysilane, vinyl-tris(beta-methoxyethoxy)-silane, gamma-methacryloxy-propyl-trimethoxysilane, and gamma-glycidoxy-propyl-trimethoxysilane.

The radiation-sensitive precursors employed in the method according to the invention, which are of oligomeric and/or polymeric nature, have been described in the co-pending U.S. patent application entitled "Method for the preparation of polyimide and polyisoindoloquinazoline dione precursors", (VPA 84 P 3116US, Siemens).

These precursors generally have the following structure:

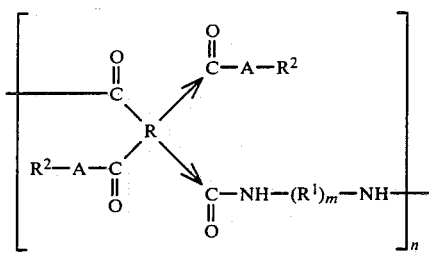

The arrows contained in the formula are to express the fact that the two substitutents in question can interchange their position at R. This is of importance for the reason that R, as will be explained below, involves a cyclic radical.

In the formula, n signifies an integer of 2 to about 100, and m is 0 or 1.

$R$, $R^1$, $R^2$ and A have the following definitions:

R is an optionally halogenated—at least partially aromatic and/or heterocyclic tetravalent, i.e., tetrafunctional, radical, in which two respective valences are arranged in adjacent position to each other; if the radical R has several aromatic and/or heterocyclic structure elements, the valence pairs are respectively located at the terminals of such structure elements;

$R^1$ is an optionally halogenated divalent, i.e. difunctional radical of a structure which is aliphatic and/or cycloaliphatic, optionally having hetero atoms, and/or a structure which is aromatic and/or heterocyclic;

$R^2$ is an olefinically unsaturated radical, for example an allyl ether-containing group, in particular an optionally substituted—(meth)acrylic ester-containing group or a propargyl group;

A signifies —O— or —NH—.

For irradiation with light, condensation products from methacrylate-and/or acrylate-group-containing pyromellitic acid and/or benzophenone tetracarboxylic acid diesters with 4,4'-diaminodiphenyl ether or 4,4'-diaminodiphenyl-3,3'-dicarboxylic acid amide are preferred. For irradiation with electrons, the corresponding propargyl-group containing condensation products are preferred.

The production of the relief structures according to the invention takes place, as has been stated, in that the polymer precursor is applied in the form of a film or foil to a substrate and is exposed through a mask with actinic light or with electrons, or is irradiated by guiding a light, electron, ion, or laser beam; subsequently the unexposed or unirradiated film or foil portions are dissolved out or stripped, and the relief structures obtained are optionally annealed. Advantageously, the precursor can be applied on the substrate dissolved in an organic solvent; preferably N-methylpyrrolidone is used as solvent. The concentration of the solution may be adjusted so that with known coating methods, such as centrifuging, immersing, spraying, brushing or rolling, film thicknesses of 0.01 micron to several hundred microns can be produced. It has been found that for example for centrifugal coating 300 to 10,000 revolutions per minute for 1 to 100 seconds are suitable for obtaining a uniform and good surface quality. From the photoresist film applied on the substrate, which preferably consists of glass, metal, plastic or semi-conductor material, the solvent can be removed at room temperature or at elevated temperature, preferably at a temperature of 25° to 60° C., in streaming nitrogen or air. Alternatively this can be done to advantage under vacuum.

To obtain a sufficient difference in solubility between the irradiated and the unirradiated film or foil portions, depending on the composition and film thickness, exposure times between 10 and 800 seconds are sufficient in the method according to the invention, when using a 300 W or a 500 W extra-high pressure mercury lamp. After the exposing, the unexposed portions of the film or foil are dissolved out, preferably with an organic developer of low flammability. By means of the method according to the invention, images with extremely sharp contours, i.e. relief structures, are obtained which are transformed by annealing into highly heat resistant polymers resistant to acids and bases. Generally temperatures of from 150° to 500° C. can be chosen, the preferred annealing temperature being 300° to 400° C. The annealing time is generally half an hour, no discoloration being observable under inert gas. The edge sharpness and dimensional accuracy of the relief structures are practically not impaired by the annealing. Moreover, despite a film thickness loss occurring during annealing, the good surface quality of the relief structures is preserved.

The radiation-sensitive precursors employed in the method according to the invention are polycondensation products which are produced in the presence of carbodiimides. They are polycondensation products of olefinically unsaturated difunctional diesters, in the form of addition products from tetracarboxylic acid dianhydrides and unsaturated alcohols, with diamines (polyimide precursors) or with o-aminoamides, i.e. diamines with ortho-positioned amido groups (polyisoindolo-quinazoline dione precursors). For the preparation of the diesters there are employed as tetracarboxylic acid diannydride preferably the anhydride of pyromellitic acid and of benzophenone tetracarboxylic acid, as unsaturated alcohol preferably hydroxyethyl acrylate and hydroxyethyl methacrylate. Among the diamino compounds 4,4'-diaminodiphenyl ether is preferred, among the o-aminoamides, 4.4'-diaminodiphenyl-3,3'-dicarboxylic acid amide. The carbodiimide preferably used is dicyclohexyl carbodiimide; carbodiimides, being compounds of the structure R'—N=C=N—R".

In the method according to the invention, preferably polymer precursors from aromatic components are employed, so that during the thermal treatment, i.e. during the annealing, polymers having the following structure units are formed:

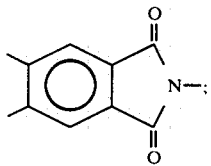

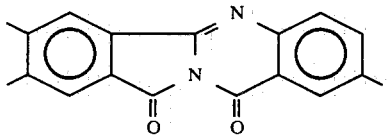

The foregoing compound classes belong to the semi ladder polymers or ladder polymers and are outstanding for their high thermal stability (to about 500° C.).

The relief structures according to the invention can be utilized to produce passivation layers on semiconductor components, thin- and thick-film circuits, solder protection layers on multi-layer circuits, insulating layers as component parts of layer circuits and miniaturized protective and insulating layers on electrically conducting and/or semiconducting and/or insulating base materials, in particular in the field of microelectronics or generally for the fine structuring of substrates. Preferably, the highly heat resistant relief structures serve as masks for wet and dry etching processes, currentless or electro-deposition of metals and vapor deposition methods, and also—in the form of very thick structured layers—as alpha-ray protection on the cell fields of memory components and as extremely thin liquid crystal orientation layers in liquid crystal displays.

The invention will now be explained more specifically with reference to embodiment examples.

EXAMPLE 1

A. Preparation of a radiation-sensitive polyimide precursor

To 32.2 parts by weight of benzophenone tetracarboxylic acid dianhydride (0.1 mole) in 50 parts by volume of gamma-butyrolactone are added under agitation and exclusion of moisture, 26 parts by weight of hydroxyethyl methacrylate (0.2 mole) and 0.2 parts by weight of 1,4-diazabicyclo(2,2,2)octane. After letting stand for 16 hours, the titrimetrically determined carboxyl content is 0.22 mole/100 g. Then, a solution of 16 parts by weight of 4,4'-diaminodiphenyl ether (0.08 mole) in 50 parts by volume of N-methylpyrrolidone is added to the reaction solution while stirring. Thereafter, a solution of 36 parts by weight of dicyclonexyl carbodiimide (0.18 mole) in 100 parts by volume of gamma-butyrolactone is added in drops to the reaction solution. The dicyclohexyl urea thus formed separates out as precipitate. The reaction solution is then left standing overnight at room temperature. After removal of the dicyclohexyl urea by filtering, a viscous resin solution is obtained which can be processed further to films and foils directly.

Alternatively, the photo-sensitive polyimide precursor stage can be precipitated as solid resin by dropping the resin solution into distilled water while stirring. By filtering, a light-yellow powder is then obtained, which is dried under vacuum at a pressure of $1.3 \times 10^4$ Pa and a temperature of $\leq 40°$ C. The viscosity index is 15.3 ml/g. The IR spectrum shows the absorption typical for methacrylates at 950 and 1630 cm$^{-1}$.

B. Production of the relief structure 20 parts by weight of the polyimide precursor isolated as solid resin in the foregoing manner together with 0.4 parts by weight of azidosulfonylphenyl maleimide and 0.4 parts by weight of Michler's ketone as well as 0.2 parts by weight of vinyltriethoxysilane are dissolved in 34 parts by volume of N-methylpyrrolidone and thereafter pressured-filtered through a 0.8 micron filter. By pouring about 2 ml of the solution on an aluminum disc rotating at 3000 revolutions per minute, a homogeneous yellow film is obtained, which is dried under vacuum (pressure: $1.3 \times 10^4$ Pa) at a temperature of 50° C. The film thickness, determined with an alpha-step film thickness measuring device, is 5 micron. The film obtained is then exposed through a contact mask with a 500 W extra-high pressure mercury lamp for 30 seconds and thereafter developed with N-methylpyrrolidone for 20 seconds. Rinsing with xylene is advantageous, in particular for the fine structure production. After developing, sharp-edged reproductions are obtained; structures of 5 microns are resolved properly. The transformation of the relief structures into polyimide relief structures by an annealing process at 400° C. (duration: 30 min) leads to a film thickness reduction, but surprisingly not to an impairment of the reproduction precision.

The relief structures produced in the described manner exhibit the excellent thermal, electrical, chemical and mechanical properties of the polyimide polydiphenyletherpyromellitimide. The IR spectrum shows the band at 5.6 microns typical for imides.

EXAMPLE 2

A. Preparation of a radiation-sensitive polyisoindoloquinazoline dione precursor To 43.6 parts by weight of pyromellitic acid dianhydride (0.2 mole) in 100 parts by volume of N-methylpyrrolidone are added under agitation and exclusion of moisture 46.4 parts by weight of hydroxyethyl acrylate (0.4 mole) and 0.4 parts by weight of 1,4-diazabicyclo(2,2,2octane. The reaction solution is then left standing at room temperature for 15 hours. Then 51.7 parts by weight of 4,4'-diaminodiphenyl-3,3'-dicarboxylic acid amide (0.19 mole) in 100 parts by volume of a dimethylacetamide/N-methylpyrrolidone mixture (volume ratio 1:1) are added to the solution of the diester. Thereafter a solution of 74 parts by weight of dicyclohexyl carbodiimide (0.36 mole) in 50 parts by volume of N-methylpyrrolidone is added in drops to the solution while stirring and cooling. With slight evolution of heat, dicyclohexylurea precipitates. After a post-reaction period of 5 hours, the dicyclohexyl urea is separated by filtering.

B. Production of the relief structure 0.5 g N-phenyl maleimide and 0.2 g of Michler's ketone as well as 0.1 g vinyl trimethoxyethoxysilane are added to 20 ml of the viscous solution obtained. The solution then is filtered through a 0.8 micron filter and subsequently centrifuged on a silicon disc with a plasma nitride surface at 3500 revolutions per minute to form a homogeneous film. After drying under vacuum (pressure: $1.3 \times 10^4$ Pa) for 3 hours at 40° C., the film thickness is 7 microns. If the coated silicon disc is exposed through a contact mask with a 350 W extra-high pressure mercury lamp, one obtains—at an exposure time of 60 s—after developing with N-methylpyrrolidone (duration: 30 s) relief structures which, by annealing for 30 minutes at 430° C., can be transformed into polyisoindoloquinazoline dione relief structures. This does not affect the quality of the relief structures.

What is claimed is:

1. A method for the preparation of a highly heat resistant polyimide or polyisoindoloquinazoline dione relief structure which comprises applying a radiation-sensitive soluble polymer precursor to a substrate in the form of a film or foil, irradiating the film or foil through a negative pattern using actinic light or using electrons or a light, electron, ion or laser beam, and removing the unirradiated or unexposed film or foil portion, wherein the polymer precursor is a polycondensation product of a diamino compound or a diamino compound having at least one ortho-positioned amido group and an olefinically unsaturated tetracarboxylic acid diester of an aromatic and/or heterocyclic tetracarboxylic acid dianhydride and an olefinically unsaturated alcohol which polycondensation product is prepared using a carbodiimide to cause the condensation reaction.

2. A method according to claim 1 further comprising annealing the irradiated or exposed film or foil portion remaining after removal of the unirradiated or unexposed portion.

3. A method according to claim 1 wherein the polymer precursor is employed together with a light- or radiation-sensitive compound capable of copolymerization.

4. A method according to claim 3 wherein the light- or radiation-sensitive compound is an N-substituted maleimide.

5. A method according to claim 1 wherein the polymer precursor is employed together with a photo-initiator or photosensitizer.

6. A method according to claim 5 wherein the photo-initiator or photo-sensitizer is 4,4'-bis(dimethylamino)benzophenone, a benzoimidazole or a ketocoumarin.

7. A method according to claim 1 wherein an adhesion promoter is used.

8. A method according to claim 7 wherein the adhesion promoter is a silane.

9. A method according to claim 1 wherein a polycondensation product of an olefinically unsaturated pyromellitic acid or benzophenone tetracarboxylic acid diester Dwith 4,4'-diaminodiphenyl ether or with 4,4'-diaminodiphenyl-3,3'-dicarboxylic acid amide is used.

10. A highly heat resistant polyimide or polyisoindoloquinazoline dione relief structure, prepared according to claim 1.

11. A relief structure according to claim 10 applied as a resist with intermediate protective function for lithographic structuring of a surface.

12. A relief structure according to claim 10 applied as a durable coating or a pattern on a surface.

13. A relief structure according to claim 10 applied as a protective and insulating material on an electrical component.

14. A relief structure according to claim 10 applied as an alpha-ray protection for a memory component.

15. A relief structure according to claim 10 applied as an orientation layer in a liquid crystal display.

* * * * *